United States Patent
Nadkarni

Patent Number: 5,825,172
Date of Patent: Oct. 20, 1998

[54] CONTINUOUS UP/DOWN SPECTRUM SCALING OF SIGNALS

[76] Inventor: Gopalkrishna G. Nadkarni, 2962 Belt Line Rd. #1310, Garland, Tex. 75044

[21] Appl. No.: 838,855

[22] Filed: Apr. 11, 1997

[51] Int. Cl.⁶ .................................................. G01R 23/175
[52] U.S. Cl. ............................ 324/76.35; 324/77.11; 333/140; 333/159; 368/200
[58] Field of Search .............................. 324/76.12, 77.11, 324/76.29, 76.35, 76.49; 333/140, 147, 149, 154, 159; 368/200

[56] References Cited

U.S. PATENT DOCUMENTS 5,481,182  1/1996  Nadkarni et al. .................... 324/76.24
5,502,558  3/1996  Menders et al. ........................ 356/28.5

*Primary Examiner*—Glenn W. Brown
*Attorney, Agent, or Firm*—Sidley & Austin

[57] ABSTRACT

A rotating transmission line for use in spectrum up-scaling or down-scaling of signals. The rotating medium is characterized by different velocity gradients, whereby when a signal propagates in such medium, the signal undergoes a Doppler effect as it propagates through the moving medium.

12 Claims, 3 Drawing Sheets

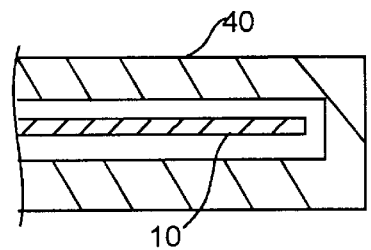
Fig. 2
Fig. 1
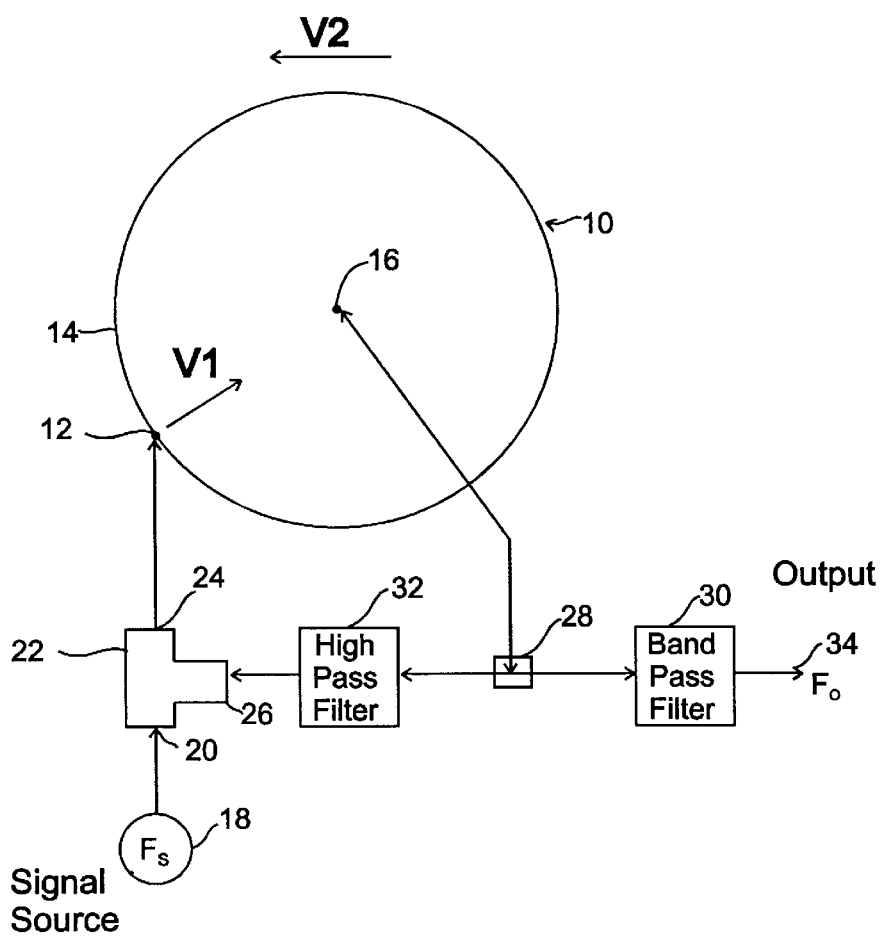

CONTINUOUS UP/DOWN SPECTRUM SCALING OF SIGNALS

TECHNICAL FIELD OF THE INVENTION

The present invention relates in general to equipment for the spectrum up-scaling or down-scaling of signals, and more particularly relates to methods and apparatus for accomplishing the continuous spectrum scaling of signals.

BACKGROUND OF THE INVENTION

When a signal undergoes a Fourier transformation, it is expressed in terms of a set of harmonically related phasors which can be graphically represented by the spectrum. Each harmonic of the spectrum has a specific amplitude, phase and frequency. Scaling in frequency of the spectrum corresponds to the inverse scaling in time of the signal. A common illustration is the effect on the frequency content that results when an audio tape is recorded at one speed and played back at a different speed. If the playback speed is higher than the recording speed, then the frequency is scaled up, which corresponds to compression in time, and vice versa. In practice, this inverse relationship between time and frequency may be valuable for several situations in the field of electrical systems. For instance, high speed single shot events are difficult to capture and record numerically using present day analog-to-digital converters. By down-scaling all of the frequencies of the spectrum, the signal can be stretched in time and then recorded in numerical form using conventional technology.

The technique of spectrum scaling is well known in signal processing and conditioning systems. It is understood that the techniques rely on the scaling of the Fourier transform relationship which is difficult to implement in real time for high speed signals due to the large computational time involved in the fast Fourier transform algorithms. An example of a noncontinuous technique for up/down spectrum scaling of signals is described in U.S. Pat. No. 5,481,182 by Nadkarni et al. In such patent, the up or down conversion of frequencies is achieved using the Doppler effect. As signals propagate over a transmission line having multiple delays, samples of the signal are obtained at each delay point, and the samples are utilized to reconstruct the original source signal without losing any characteristics. While such digital technique is well adapted for capturing single event signals, a need exists for a new apparatus and technique which provides for a continuous up or down scaling of the frequencies of input signals. Another need exists for a technique for spectrum scaling of signals while achieving very low loss in the conversion process.

SUMMARY OF THE INVENTION

In accordance with the principles and concepts of the invention, disclosed is a moving transmission line that provides for the continuous spectrum scaling of signals.

In accordance with the preferred embodiment of the invention, a rotating transmission line comprises a disc rotatable at a given speed. The rotating disc is electrically shielded so that electromagnetic energy is not radiated from the disc. Moreover, the rotating transmission line is provided with an input contact to the disc for inputting signals from a source, and an output contact. For up-scaling of frequencies, the output contact is located preferably at the center of the disc, and the input contact is displaced a given radius from the center of the rotating disc.

The output contact of the rotating disc is coupled to two circuits, one being a very narrow bandpass filter for selecting the output frequency desired to be achieved from the spectrum scaling process. The output contact is also coupled through a highpass filter and to a coupling circuit or routing device. Both the signal from the source as well as the signal output from the highpass filter are independently coupled back to the input contact of the rotating transmission line. The highpass filter functions to eliminate those lower frequencies which are not desired to be recirculated from the output contact back to the input rotating transmission line.

The spectrum scaling is achieved by virtue of the gradient of the rotational or angular velocity of the disc in conjunction with the propagation velocity of the electrical wave as it is input to the disc. As can be appreciated, the radial velocity of the disc is greatest at the circumference and is the least near the center of the disc, whereas the propagation velocity of the wave through the disc medium remains relatively constant.

The down-scaling of frequencies can be achieved with the invention so that, for example, by inputting a continuous 1 KHz electrical signal to the system, a continuous 10 Hz signal can be obtained at the output, with relatively insignificant losses in the system.

In accordance with another embodiment of the invention, the Doppler effect can be also utilized in conjunction with a moving medium to provide a spectrum scaling of sound or audio signals.

BRIEF DESCRIPTION OF THE DRAWINGS

Further features and advantages will become apparent from the following and more particular description of the preferred embodiment of the invention, as illustrated in the accompanying drawings in which like reference characters generally refer to the same parts, elements or functions through the views, and in which:

FIG. 1 diagrammatically illustrates the basic components of the rotating transmission line according to the preferred embodiment of the invention;

FIG. 2 illustrates a partial cross-sectional view of the rotating transmission line showing the electromagnetic shielding thereof;

DETAILED DESCRIPTION

Figure 3:
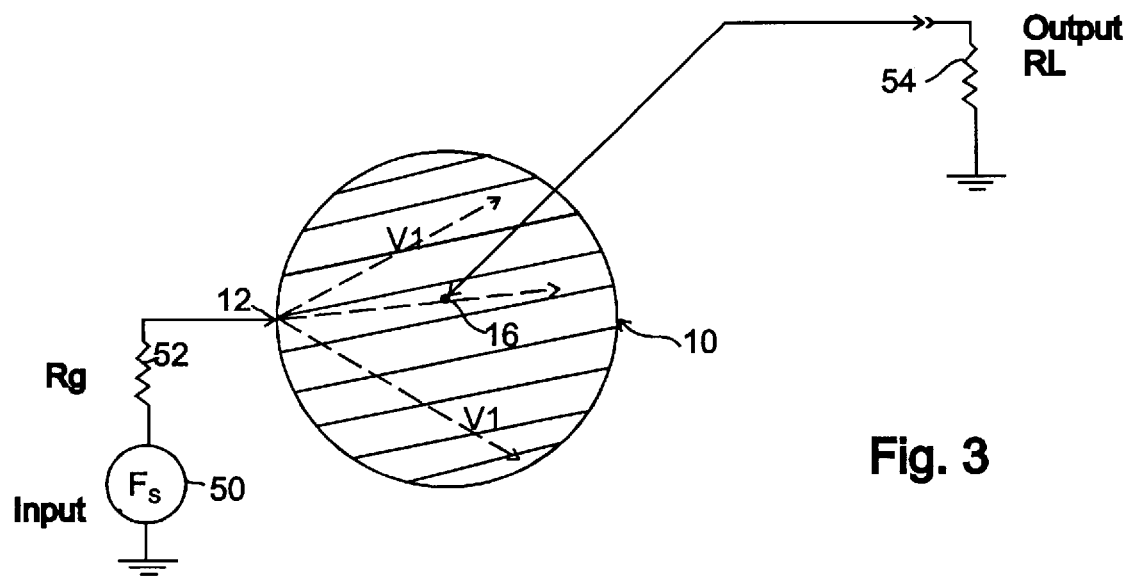
FIG. 3 illustrates in simplified form the vector components of an electrical wave as it propagates from the input to the rotating disc.

FIG. 1 illustrates a diagram of the rotating transmission line according to the preferred embodiment of the invention. The rotating transmission structure includes a conductive disc 10 that is preferably rotated at a constant speed. The disc 10 can be rotated by motors and feedback circuits such as well known in the field for driving hard disc drives, and the like. When employed to provide spectrum up-scaling of frequencies, a broad band electrical contact 12 is provided at a location spaced from the center of the disc 10. Preferably, although not necessarily, the broad band input contact 12 is located at the peripheral edge 14 of the disc. In like manner, a broad band output contact 16 is placed at or near the center of the disc 10. As will be described more thoroughly below, the aspect of the wave velocity of a signal provided at the input contact 12 together with the different radial velocities at different disc radii, enables the signals reaching the output contact 16 at the center of the disc 10 to undergo a Doppler effect. The Doppler effect is the most pronounced at higher radial velocities, and becomes smaller as the electrical wave approaches the center of the disc 10.

In providing spectrum up-scaling of signals, electrical signals are coupled to an input 18 of the system and to a first input 20 of a routing device 22. From the routing circuit output 24, the source signals are coupled to the input contact 12. The routing device 22 includes a second input 26 for receiving recirculating signals. Electrical signals provided at the first input 20 and the second input 26 of the routing circuit 22 are not mixed or otherwise heterodyned in the routing device 22, but rather are carried as separate and independent signals to the routing circuit output 24. The routing device is thus a linear circuit, such as either a "Y" connected transmission line, a dual amplifier circuit with a single output having an overall gain of unity, or other similar linear circuits and devices. Source electrical signals and recirculation or feedback signals coupled via the routing device 22 to the input contact 12 undergo a Doppler effect. In practice, the routing device can be eliminated, whereby the source signals are coupled to a first input contact to the rotating disc 10, and the feedback signals are coupled to an adjacent second input contact. Those electrical waves that reach the central output contact 16 are removed from the rotating disc and coupled to an electrical junction 28. An output bandpass filter 30 and a highpass filter 32 have respective inputs coupled to the junction 28. The bandpass filter 30 preferably has an extremely narrow bandpass at a frequency desired to be achieved at the rotating transmission line system output 34. For example, if a 1 MHZ signal is provided at the source input 18 and after undergoing the Doppler effect, a 100 Hz signal is provided at the transmission line system output 34, the bandpass filter would be designed to narrowly pass the 100 Hz signal. Bandpass filters of many designs and types are suitable for providing such function.

The highpass filter 32 may also be of conventional design for passing frequencies above a cutoff point, and blocking the passage of signals with frequencies therebelow. The highpass filter 32 is preferably of the type having a very sharp cutoff frequency, in the example, at about 100 Hz. Thus, while frequencies below 100 Hz are blocked by the highpass filter, all frequencies above such cutoff frequency are passed and coupled to the second input 26 of the routing device 22. These highpass frequencies are allowed to be input to the rotating disc 10 and recirculated to undergo further or additional Doppler effects. Power losses to the rotating transmission line are minimized by blocking and eliminating the recirculation of low frequencies. As can be appreciated, the bandpass filter 30 and the highpass filter 32 are designed to have particular characteristics to achieve the spectrum up-scaling of desired signals. Indeed, the filters 30 and 32 can be variable or programmable to achieve different up-scaling characteristics.

Figure 4A:
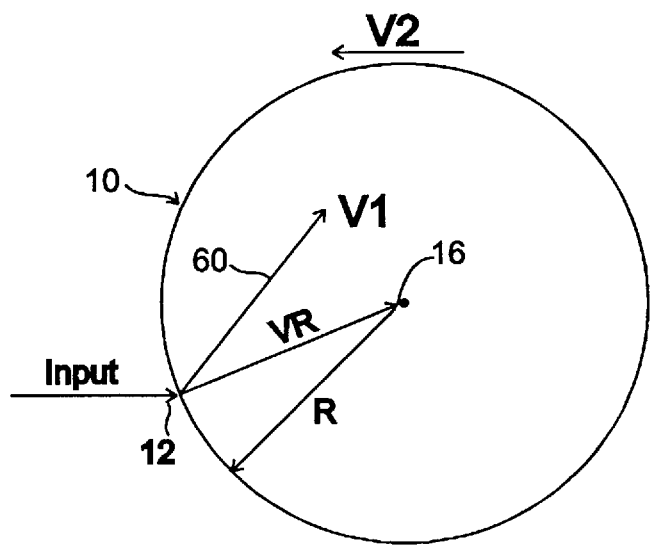
FIGS. 4a and 4b illustrate the vector components of the wave velocity, including the radial velocity and the resultant velocity.
Figure 4B:
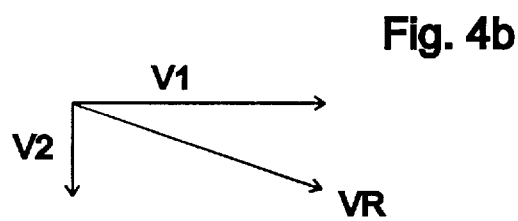
Figure 5:
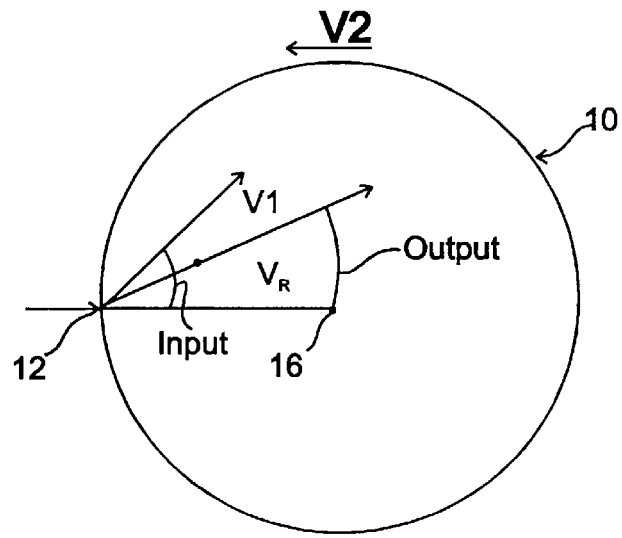
FIG. 5 diagrammatically illustrates the vector components of a wave in order for it to reach the output contact at the center of the disc.

With reference now to FIG. 2, there is shown a partial cross-sectional view of the rotating disc structure. The disc 10 is entirely housed within a conductive shield 40 to prevent radiation of electromagnetic signals from the conductive disc 10. As such, the rotating disc 10 functions as a transmission line, rather than an antenna. The conductive shield 40 may be typically connected to a circuit common potential, such as ground. Moreover, the conductive shield 40 does not contact the rotating disc 10. The dielectric medium that electrically isolates the conductive disc 10 from the conductive shield 40 is preferably air. Hence, the rotating disc 10 and shield 40 electrically function similar to a transmission line, such as the coaxial type. Reference is now made to FIGS. 3–5 where there is illustrated the spectrum scaling of signals employing the rotating transmission line. As noted above, there is a continuous spectrum scaling of signals as long as a source signal is input to the system. Moreover, based on a given spectrum scaling factor, signals will be recirculated a number of times to undergo successive Doppler effects before reaching the center frequency of the bandpass filter 30. As such, there is an inherent time delay that is a function of the scaling factor between the input of a source signal and the output of the desired spectrum scaled signal. With such a system, one can obtain highly accurate conversions of signal frequencies. The radial dimensions of the disc 10, the rotating speed and the frequency characteristics of the filters determine in a large part the operational frequency of the rotating transmission line. Accordingly, very low frequencies up to microwave frequencies, and higher, can be accommodated by the invention.

With reference now to FIG. 3, there is shown in simplified form the rotating disc 10. A signal source 50 is coupled via a source impedance 52 to the broadband input contact 12 of the system. Because the disc 10 is spinning, the input contact 12 injects the source signals continuously around the periphery of the disc 10. Injection source frequency is then transmitted outwardly into the conductive disc 10. As the disc 10 continues to rotate, some frequency wave vectors find their way to the disc center, the other frequency vectors do not. Output frequencies finding a path to the disc center are coupled via the broadband output contact 16 to a load resistance 54. The output of the system is taken across the load resistance 54.

An electrical wave applied to the rotating disc 10 at the input contact 12 is transmitted outwardly into the conductive disc 10 in a uniform manner, with the wave fronts being of equal radii with respect to the point of input. The vectors $V_1$ illustrate the transmission of the signal in the disc 10 in all directions. Assuming the disc dimensions are small as compared to the periodicity of the input signal, there is only a single mode of transmission. For the following analysis, the traveling wave velocity of the electrical signal is represented by $V_1$, the radial velocity of the disc at given points is $V_2$ and the radius of the disc is R. If the disc 10 were stationary, the only movement would be the propagation of the electrical waves and no Doppler effect would occur. However, in accordance with an important feature of the invention, the disc 10 rotates to thereby allow the electrical waves to propagate on a moving medium, thus resulting in a Doppler effect. As will be set forth below, the Doppler effect can either be additive or subtractive with regard to the original source wave to produce the up and down spectrum scaling of signals.

As can be appreciated from the foregoing, an electrical wave that is initiated at the input contact 12 and has a vector component directed to the center, does not reach the center of the disc 10 as it travels a distance R. Rather, because of the rotational movement of the disc, the wave is deflected in an off-center direction. With regard to FIG. 4a, there is shown the spinning disc 10 that is rotating in a counter-clockwise direction, with a velocity $V_2$ at a radius R from the center of the disc 10. In order for a wave front to propagate from the input contact 12 and reach the center output contact 16, a vector portion thereof must be directed as shown by the vector 60. With the vector component $V_1$ which represents the electrical wave velocity, and the vector $V_2$ which represents the radial velocity of the disc, the resultant velocity vector $V_r$ is shown in FIG. 4b. The resultant vector $V_r$ is that which reaches the center output contact 16 and undergoes the Doppler effect. The electrical waveform carried on the rotating disc undergoes the Doppler effect due to the velocity gradient of $V_2$ based on disc radius. As can be appreciated, the linear velocity at any point on the disc is $V=\omega r$, where $\omega$ is the angular velocity at a given radius from the center of the disc. The linear velocity of the rotating disc is greatest at its peripheral edge and decreases toward the center of the disc 10.

FIG. 5 is another illustration of the vector components of the wave velocity $V_1$, the radial disc velocity $V_2$, and the resultant velocity $V_R$. The angle I (Input) is the phase angle between the radius R of the disc 10 and the wave velocity vector component $V_1$. The angle O (Output) represents the resultant vector $V_R$ with respect to the radius R. It is the resultant vector $V_R$ that must exist with respect to the signal wave front in order for such wave portion to reach the center of the disc 10 and be output by the output contact 16. The mathematical expression for the spectral output signature is set forth as follows:

$$F_O = F_s((V_1-V_2)\div V_1)^x,$$

where $F_s$ is the signal input and x is a scaling factor.

It can be appreciated that the Doppler effect can be either additive or subtractive to thereby provide up-scaling or down-scaling of source signals $F_s$.

As noted above, in view that the disc 10 is rotating in the direction of $V_2$ shown in FIG. 5, the wave front vector must point in a partially opposite direction with respect to $V_2$ in order to reach the center of the disc 10, where the output contact 16 is positioned. It should be understood that the output contact 10 need not necessarily be at the center of the disc 10, whereupon the angle of the vector $V_R$ would be different. The first tangential vector at the point of contact for this wave vector is expressed as $V_1 \sin i(1) - V_2$, and the second radial vector is $V_1 \cos i(1)$. In this case, the Doppler effect is $V_R/V_1$, and the angle of $V_R$ with respect to the radius R is:

$$(i(2))=\tan^{-1}((V_1 \sin i(1)-V_2)/(V_1 \cos i(1)).$$

The Doppler effect is thus equal to:

$$V_R/V_1 = ((V_1 \sin i(1)-V_2)^2+(V_1 \cos i(1))^2)^{0.5}/V_1$$

As noted above, the disc velocity $V_2$ becomes smaller as the disc radius becomes smaller and thus the Doppler effect becomes smaller as the wave travels from the peripheral edge of the disc 10 toward the center of the disc 10. As noted above, $V_2=\omega r$, where $\omega$ is the angular velocity of the disc 10 and r is the radius at any point on the disc with respect to the center contact 16.

Since i(n) commences at i(1) and drops to zero as r goes from R to zero, i(1)/R is a constant by first approximation. In view of the foregoing, $i(1)/R = k1$, and by similar approximation, $(V_1-V_R)/R=k2$, then the Doppler effect at any radius r is:

$$D_r = \omega k2[r^2(n)\cdot\sin(k1\cdot r(n))-r^2(n-1)\cdot\sin(k1\cdot r(n-1))]$$

as r goes from O to R for different values of n.

The overall effective Doppler is thus the integral of $D_r$ from r=0 to r=R, divided by R. In other words, the effective Doppler is:

$$D_t = \int_O^R \frac{D_r}{R}$$

The effective Doppler $D_t$ is for one signal wave which is expected to reach the output contact 16 at the center of the disc 16. The signal wave vectors that have directions and corresponding angles which cause them to miss the output contact are lost. This will occur for a certain range of magnitudes of the disc velocity $V_2$. It should be noted that if the input contact 12 is connected at the center of the disc, and the output contact 16 is coupled to the disc at a radius r, the Doppler effect will be additive, namely, $(V_1+V_2)/V_1$.

If the signal transmission and contact losses are negligible, the spectrum scaling factor $D_t$ will have certain losses associated with it, as only some of the wave vectors will reach the center, output contact 16. If these losses are negligible, a continuous spectrum scaling will be achieved.

The signal output of the system can be expressed as $F_{out}=F_s(D_t)^x$, where x is determined by the functionality of the bandpass filter 30 and the highpass filter 32. If, for example, the scaling factor $D_t$ is 0.01, and the rotating transmission line is configured for spectrum down-scaling, this means that if a 1 MHZ signal is the signal source 18 (FIG. 1) and coupled to the input contact 12 via the routing device 22, the first frequency coupled to the output contact 16 will be a 10 KHz frequency signal. If, in the example, the bandpass filter 30 has a 100 Hz center frequency, there will be no output signal at this time. Hence, the 10 KHz signal will pass through the highpass filter 32 and be also coupled together with the source signal 18 to the input contact 12 via the routing device 22. In the second circulation of the signals, they undergo further Doppler effects, whereupon the 10 KHz frequency is further divided by the scaling factor 0.01, whereby a 100 Hz signal appears at the output contact 16. In this event, the 100 Hz signal is passed by the bandpass filter 30 and an output down-scaled frequency then appears. In addition, the 100 Hz signal is blocked by the highpass filter 32 so that it is not thereafter recirculated to undergo further Doppler effects and/or signal losses. By blocking these lower frequencies, they are prevented from undergoing unnecessary Doppler effects. In this example, it is also noted that a time delay is involved during which the Doppler effects cause the signal to be up-scaled or down-scaled so that they reach the frequency of the bandpass filter 30. It is noted that the inputs and outputs of the rotating transmission line are reversible to thereby achieve either spectrum up-scaling or down-scaling. It is also noted that those skilled in the art may find that other types of filters can be used to achieve different effects. Indeed, the highpass filter may be dispensed with if power losses are not a concern.

Figure 6:
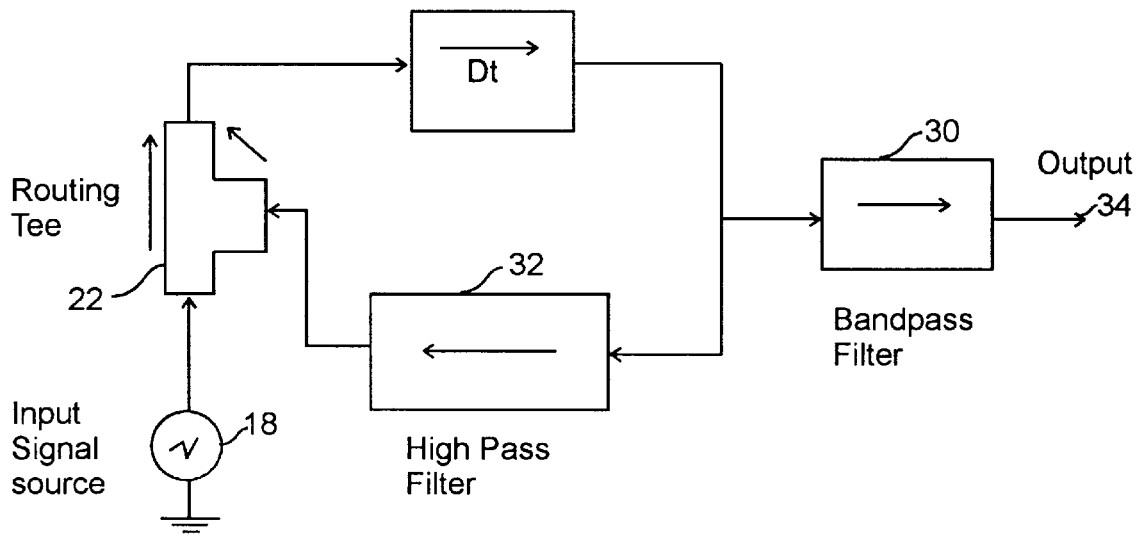
FIG. 6 illustrates the functional blocks of the rotating transmission line according to the preferred embodiment, with the rotating disc diagrammatically shown in equation form.

FIG. 6 illustrates a functional diagram of the principals and concepts of the invention. Here, the mechanical portion of the rotating transmission line is shown as a mathematical function, having a spectrum scaling factor $D_r$. Thus, the mechanical portion of the rotating transmission line may indeed be constructed as an electrical equivalent. Those skilled in the art may desire to carry out the invention utilizing a magnetic field that varies in strength based on radius to thereby cause electrons to undergo a Doppler effect when moving in radial paths. Thus, the electrons will undergo a Doppler effect without involving mechanically moving parts of the system.

Although the present invention has been described above with a certain degree of particularity, it is understood that the present disclosure has been made by way of example, whereupon changes in detail or structure may be made without departing from the sprit and scope of the invention, as defined by the appended claims.

What is claimed is:

1. A spectrum scaling device, comprising:

a moving medium for carrying signals;

an input device for coupling signals to an input of the moving medium so that the movement of the medium together with the propagation of the signals in the medium allows the signals to undergo a Doppler effect, and an output device for coupling signals from an output of the moving medium, whereby the frequency coupled at the output of said moving medium is different from the frequency coupled to said input of said moving medium.

2. The spectrum scaling device of claim 1, wherein said moving medium comprises a rotating disc.

3. The spectrum scaling device of claim 1, wherein said signals comprise electrical signals.

4. The spectrum scaling device of claim 2, further including a feedback circuit for recirculating electrical signals from said output device back to said input device.

5. The spectrum scaling device of claim 4, wherein said feedback circuit comprises a highpass filter.

6. The spectrum scaling device of claim 3, further including a bandpass filter for coupling signals from the moving medium output to a system output.

7. A spectrum scaling device, comprising:

a rotating conductive disc;

a first contact and a second contact electrically coupled to said rotating disc; and a feedback circuit for coupling signals from said second contact back to said first contact.

8. The spectrum scaling device of claim 7, further including a bandpass filter for carrying signals from said second contact.

9. The spectrum scaling device of claim 7, further including a routing device having a first and second input, and an output, said routing device output coupled to said first contact of said rotating disc, a source of signals to be spectrum scaled coupled to said first input, and said feedback circuit coupled to said second input of said routing device.

10. The spectrum scaling of claim 7, wherein said spectrum scaling device is configured for spectrum up-scaling of signals.

11. The spectrum scaling device of claim 7, wherein said spectrum scaling device is configured for spectrum down-scaling.

12. A method of spectrum scaling of signals, comprising the steps of:

coupling signals to a moving medium; and propagating the signals at different velocities in the moving medium with respect to an output of the moving medium to thereby produce a frequency at the output that is different from a corresponding frequency input to the moving medium.

* * * * *